(12) United States Patent  
Higashi et al.

(10) Patent No.: US 8,077,447 B2
(45) Date of Patent: Dec. 13, 2011

(54) ELECTRONIC ELEMENT PACKAGE AND METHOD OF MANUFACTURING THE SAME

(75) Inventors: Kazushi Higashi, Osaka (JP); Shinji Ishitani, Osaka (JP)

(73) Assignee: Panasonic Corporation, Osaka (JP)

( * ) Notice: Subject to any disclaimer, the term of this patent is extended or adjusted under 35 U.S.C. 154(b) by 914 days.

(21) Appl. No.: 11/952,173

(22) Filed: Dec. 7, 2007

(65) Prior Publication Data
US 2008/0137270 A1   Jun. 12, 2008

(30) Foreign Application Priority Data

Dec. 12, 2006 (JP) ................................. 2006-333910
Dec. 28, 2006 (JP) ................................. 2006-353565
Nov. 30, 2007 (JP) ................................. 2007-309578

(51) Int. Cl.
*H05K 5/00* (2006.01)
(52) U.S. Cl. ..................................... 361/679.01; 73/493
(58) Field of Classification Search ............... 73/514.36, 73/493, 514.16, 579; 29/592; 361/679.01
See application file for complete search history.

(56) References Cited

U.S. PATENT DOCUMENTS

| | | | | |
|---|---|---|---|---|
| 3,665,225 A * | 5/1972 | van den Heuvel et al. | ... | 310/313 B |
| 5,406,230 A * | 4/1995 | Yamamoto | ...................... | 331/46 |
| 5,448,014 A | 9/1995 | Kong et al. | .................. | 174/52.3 |
| 5,844,348 A * | 12/1998 | Gamo | .......................... | 310/340 |
| 6,002,308 A * | 12/1999 | Gamo | .......................... | 333/187 |
| 6,011,451 A * | 1/2000 | Gamo | .......................... | 333/189 |
| 6,145,380 A * | 11/2000 | MacGugan | ..................... | 73/493 |
| 6,160,462 A * | 12/2000 | Sugiyama et al. | ............ | 333/189 |
| 6,300,676 B1 | 10/2001 | Kawai | ........................... | 257/678 |
| 6,433,654 B1 * | 8/2002 | Kanai et al. | ................... | 333/189 |
| 6,845,664 B1 * | 1/2005 | Okojie | .......................... | 73/431 |
| 7,246,524 B1 * | 7/2007 | Kholwadwala et al. | ........ | 73/715 |
| 7,296,471 B2 | 11/2007 | Ono et al. | .................. | 73/514.36 |
| 7,412,942 B2 * | 8/2008 | Pharo et al. | ..................... | 116/200 |
| 7,424,347 B2 * | 9/2008 | Babala et al. | ..................... | 701/1 |
| 7,451,653 B1 * | 11/2008 | Sippola | .......................... | 73/715 |
| 7,560,811 B2 * | 7/2009 | Sakakibara et al. | .......... | 257/704 |
| 7,659,654 B2 * | 2/2010 | Kondo | ........................... | 310/330 |
| 2004/0163470 A1 * | 8/2004 | Babala et al. | ............... | 73/514.01 |
| 2006/0130584 A1 | 6/2006 | Ono et al. | ................... | 73/514.36 |
| 2007/0210392 A1 * | 9/2007 | Sakakibara et al. | .......... | 257/414 |
| 2007/0222472 A1 * | 9/2007 | Raravikar et al. | ............. | 324/765 |
| 2007/0261497 A1 * | 11/2007 | O'Brien et al. | ................. | 73/724 |
| 2008/0190174 A1 * | 8/2008 | Kooi et al. | ..................... | 73/31.01 |
| 2008/0229829 A1 * | 9/2008 | Kondo | ............................ | 73/579 |
| 2008/0248457 A1 * | 10/2008 | Hosoya et al. | .................... | 435/4 |

* cited by examiner

*Primary Examiner* — Hezron E Williams
*Assistant Examiner* — Samir M Shah
(74) *Attorney, Agent, or Firm* — Steptoe & Johnson LLP

(57) ABSTRACT

An electronic element package includes a plate-like sensor substrate with a detector formed thereon, and a plate-like first cover substrate and a plate-like second cover substrate joined directly or indirectly to a top surface and a bottom surface, respectively, of the sensor substrate so that the sensor substrate is located between the first and second cover substrates, the sensor substrate including, a frame surrounding the detector via a space, beams joining the detector to the frame, and an electrode disposed on the frame and electrically connected to the detector, one of the first cover substrate and the second cover substrate having a through-hole which contacts an electrode. The electronic element package enables a reduction in thickness and offers improved reliability.

3 Claims, 18 Drawing Sheets

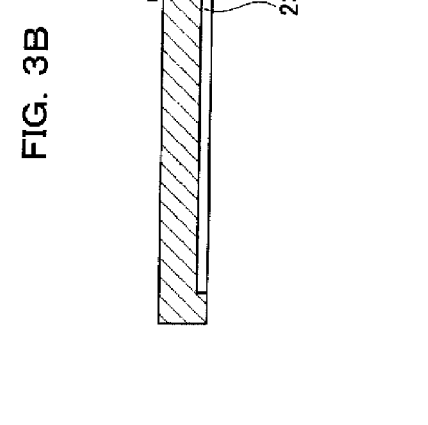
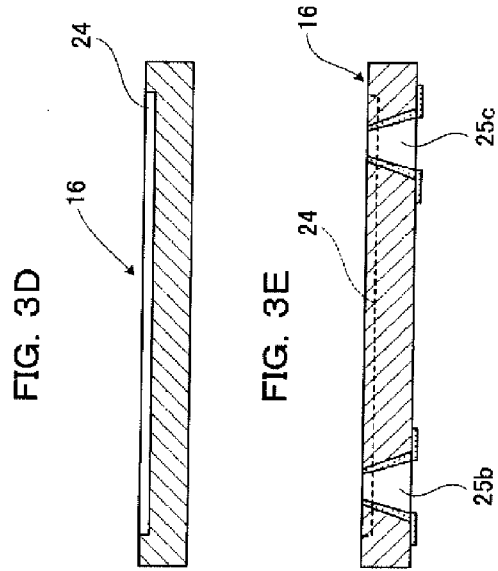
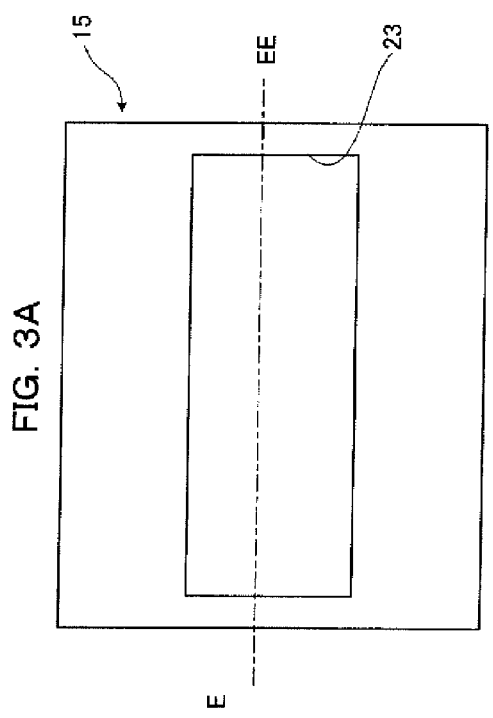
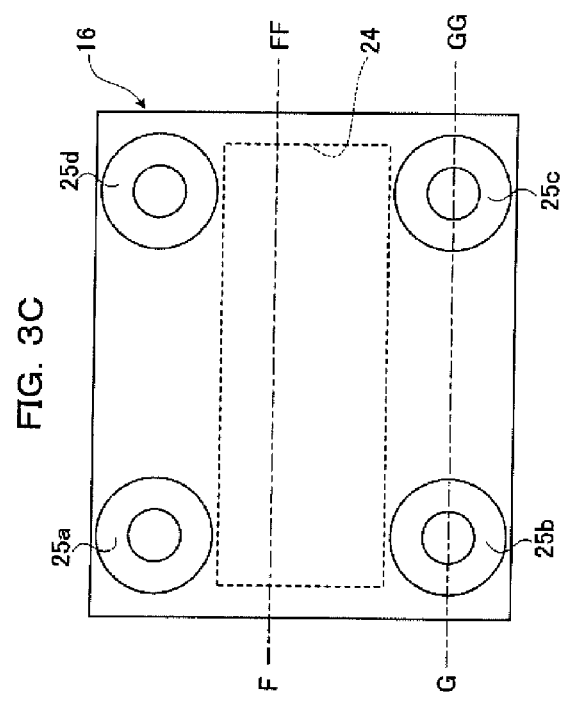

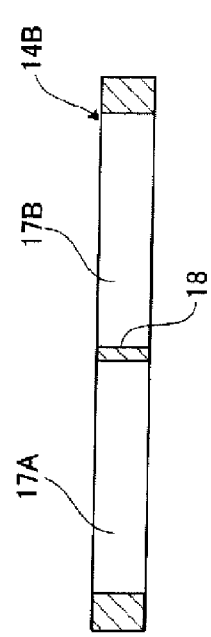
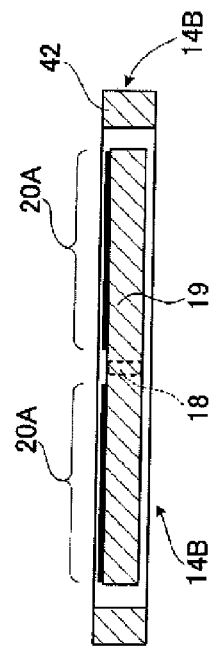
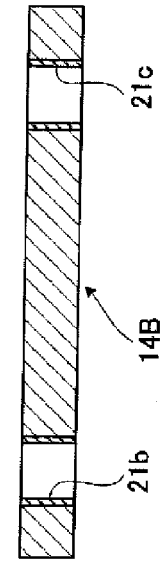
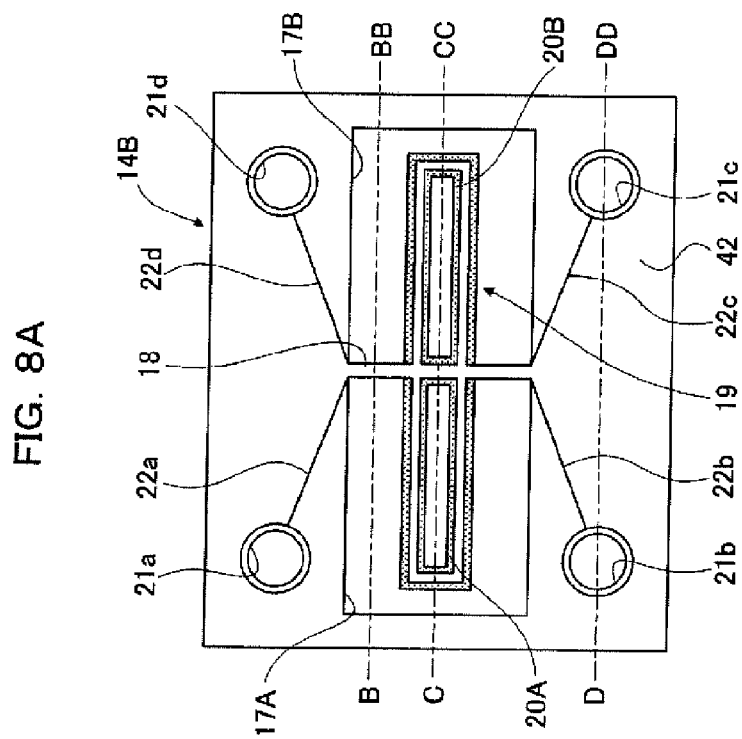

ELECTRONIC ELEMENT PACKAGE AND METHOD OF MANUFACTURING THE SAME

FIELD OF THE INVENTION

The present invention relates to an electronic element package such as an acceleration sensor and a method of manufacturing the electronic element package.

BACKGROUND OF THE INVENTION

An electronic element package described in, for example, Japanese Patent Laid-Open No. 2006-170856 shown in FIG. 19 has a package having a recessed portion 12 and an acceleration chip 1 accommodated in the package. The acceleration chip 1 has a support portion 3 located in the center of the chip 1 and fixed to a circuit board 2 and flange portions 4 located around the support portion 3. The flange portions 4 are combined with and suspended from one end of a detecting beam 5 the other end of which is connected to the top of the support portion 3. The support portion 3, the flange portions 4, and the detecting beam 5 are integrally formed on a semiconductor substrate by a micromachine technology.

Detecting elements 6 are formed at the top of the detecting beam 5 to vary an output signal in response to distortion resulting from acceleration applied to the flange portions 4. The substrate 2 is fixed to an inner bottom surface of the package with an adhesive 7.

A bonding pad 8 and the detecting elements 6 formed on an upper end surface of the support portion 3 are electrically connected together by leads (not shown). The bonding pad 8 is connected, via gold wires 10, to external extraction terminals 9 formed on the package. The external extraction terminals 9 are connected to electrode terminals 11 formed on a bottom surface of the package using conductive films formed along walls of the package. Reference numeral 13 denotes a cap.

Japanese Patent Laid-Open No. 6-318625 describes a package in which bulkhead portions 53 are formed on one surface of an element substrate 52 on which an electronic element 51 is formed so that the bulkhead portions 53 surround the electronic element 51, with a cover substrate 55 having penetration electrodes 54 to close the opening between the bulkhead portions 53 to seal the electronic element 51, as shown in FIG. 20. Reference numeral 56 denotes an electrode formed outside the cover substrate 55 and electrically connected to the penetration electrode 54 to extract an electrode of the electronic element 51.

FIGS. 21 and 22 show an electronic element package described in Japanese Patent Laid-Open No. 2000-186931. FIG. 21 is an exploded view showing a lower glass substrate 81 and an upper glass substrate 82 of the electronic element package which have not been laminated yet. FIG. 22 is a sectional view of the laminated lower glass substrate 81 and upper glass substrate 82; the sectional view is taken along line X-X in FIG. 21.

An angular speed detecting portion 83 formed on the lower glass substrate 81 is supported by the lower glass substrate 81 at opposite ends 83a and 83b thereof. An intermediate portion 83c of the angular speed detecting portion 83 is not in contact with the lower glass substrate 81 and is thus movable. The upper glass substrate 82 is joined to a frame portion 84 provided on an outer periphery of the lower glass substrate 81 for hermetic sealing. In addition to the frame portion 84, signal output portions 85a, 85b, and 85c are formed on the lower glass substrate 81 in the external extraction electrode. The signal output portions 85a, 85b, and 85c are laminated to the upper glass substrate 82 and extracted through via holes 86.

With the configuration in Japanese Patent Laid-Open No. 2006-170856, even when the support portion 3, the flange portions 4, and the detecting beam 5 are integrally formed on the semiconductor substrate by the micromachine technology, it is difficult to achieve a reduction in thickness. In contrast, the configurations in Japanese Patent Laid-Open Nos. 6-318625 and 2000-186931 enable a reduction in thickness, but the reliability of the hermetic seal structures in these configurations is still requested to be improved.

Furthermore, the configuration in Japanese Patent Laid-Open No. 6-318625 needs to prepare the cover substrate 55 with the penetration electrodes 54 preformed therein and to laminate the cover substrate 55 to the element substrate 52. Japanese Patent Laid-Open No. 2000-186931 also needs to preform the via holes 86.

An object of the present invention is to provide an electronic element package which enables a reduction in thickness and which eliminates the need to form penetration electrodes or via holes as external extraction electrodes.

DISCLOSURE OF THE INVENTION

An electronic element package according to the present invention includes a plate-like sensor substrate with a detector formed thereon, and a plate-like first cover substrate and a plate-like second cover substrate joined directly or indirectly to a top surface and a bottom surface, respectively, of the sensor substrate so that the sensor substrate is located between the first and second cover substrates, the sensor substrate including at least a first detecting portion and a second detecting portion as the detector, a frame surrounding the detector via a space, at least two beams joining the detector to the frame, and an electrode disposed on the frame and electrically connected to the detector, one of the first cover substrate and the second cover substrate having a through-hole with an inner wall of an end surface which contacts at least a part of the electrode.

Furthermore, the electrode is disposed in an area surrounded by a partial side of the frame which is located opposite the detector via a space and an outer periphery of the frame.

Furthermore, recessed portions are formed in a surface of the cover substrates located opposite the sensor substrate and are positioned in association with the detector.

Furthermore, the sensor substrate is formed thinner in a portion thereof occupied by the detector than in a periphery thereof.

A method of manufacturing an electronic element package according to the present invention, the electronic element package including a plate-like sensor substrate with a detector formed thereon, and a plate-like first cover substrate and a plate-like second cover substrate joined directly or indirectly to a top surface and a bottom surface, respectively, of the sensor substrate so that the sensor substrate is located between the first and second cover substrates includes the steps of, when producing the electronic element package, forming a junction wafer including a first wafer on which a plurality of the sensor substrates with the detectors formed thereon are mounted, and a second wafer and a third wafer on which a plurality of the first and second cover substrates, respectively, are mounted in association with the sensor substrates and which are joined to a top surface and a bottom surface, respectively, of the first wafer so that the first wafer is located between the second and third wafers, and cutting the junction wafer into electronic element packages.

An electronic element package according to the present invention includes an element substrate on which an electronic element is formed, and a cover substrate, the element substrate and the cover substrate being joined together, a bulkhead portion surrounding and sealing the electronic element in a gap between the element substrate and the cover substrate, an introduction hole formed in the cover substrate and corresponding to a first electrode on the element substrate, the introduction hole being shaped so as to have a diameter decreasing toward the element substrate, and a second electrode formed on the cover substrate to close an element substrate-side end of the introduction hole, the first electrode and the second electrode abutting against each other.

Furthermore, a groove extending toward the element substrate is formed on an inner periphery of the introduction hole.

A method of mounting an electronic element package including an element substrate on which an electronic element is formed, and a cover substrate, the element substrate and the cover substrate being joined together, a bulkhead portion surrounding and sealing the electronic element in a gap between the element substrate and the cover substrate, and an introduction hole formed in the cover substrate in association with a first electrode on the element substrate, the introduction hole being shaped so as to have a diameter decreasing toward the element substrate, the method including the steps of, when mounting the electronic element package on a land formed on a substrate, placing a conductive material on the land on the substrate at a mounting position, and pressing the electronic element package against the substrate at the mounting position with the introduction hole located opposite the substrate to guide the conductive material placed on the land at the mounting position, toward the first electrode on the element substrate through the introduction hole of the electronic element package to electrically connect the land on the substrate to the electronic element on the element substrate via the conductive material.

The configuration according to the present invention makes it possible to implement an electronic element package which enables a reduction in thickness and which offers improved reliability.

BRIEF DESCRIPTION OF THE DRAWINGS

FIG. 3A is a bottom view of a first cover substrate according to Embodiment 1;

FIG. 3B is a sectional view of the first cover substrate according to Embodiment 1 taken along line E-EE in FIG. 3A;

FIG. 3C is a bottom view of a second cover substrate according to Embodiment 1;

FIG. 3D is a sectional view of the second cover substrate according to Embodiment 1 taken along line F-FF in FIG. 3C;

FIG. 3E is a sectional view of the second cover substrate according to Embodiment 1 taken along line G-GG in FIG. 3C;

FIG. 8A is a plan view of a sensor substrate according to Embodiment 5 of the present invention;

FIG. 8B is a sectional view of the sensor substrate according to Embodiment 5 taken along line B-BB in FIG. 5A;

FIG. 8C is a sectional view of the sensor substrate according to Embodiment 5 taken along line C-CC in FIG. 8A;

FIG. 8D is a sectional view of the sensor substrate according to Embodiment 5 taken along line D-DD in FIG. 5A;

DESCRIPTION OF THE EMBODIMENTS

Figure 1A:
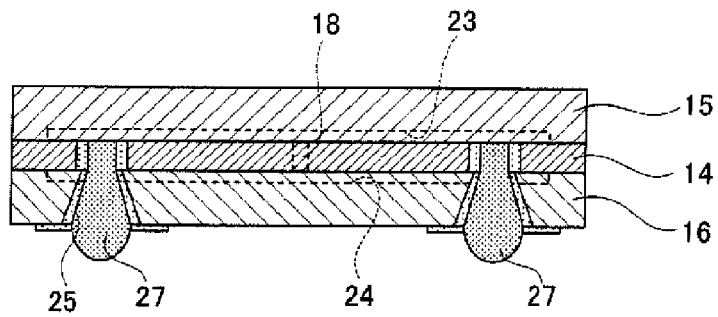
FIG. 1A is a sectional view of an electronic element package according to Embodiment 1 of the present invention.

Embodiments of the present invention will be described with reference to FIGS. 1 to 10 and 11 to 18. Components exerting similar effects are denoted by the same reference numerals.

Embodiment 1

FIGS. 1 to 4 show Embodiment 1 of the present invention.

Figure 1B:
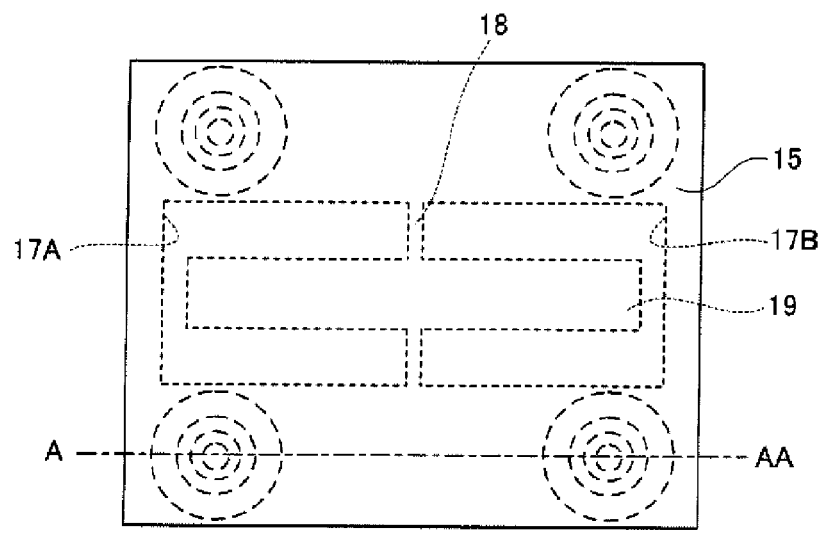
FIG. 1B is a top view of the electronic element package according to Embodiment 1.
Figure 1C:
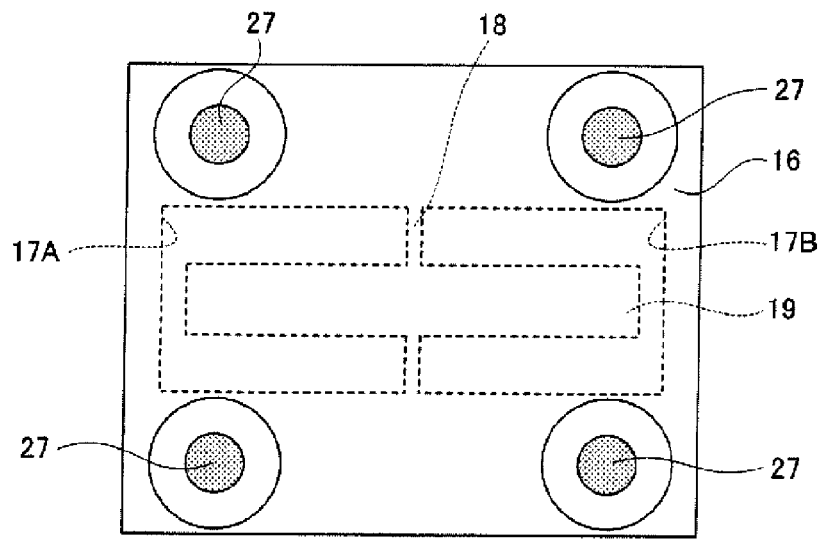
FIG. 1C is a bottom view of the electronic element package according to Embodiment 1.

FIG. 1A shows a sectional view of an electronic element package according to Embodiment 1 of the present invention. FIG. 1B is a top view and FIG. 1C is a bottom view. FIG. 1A is a sectional view of the electronic element package taken along line A-AA in FIG. 1B.

The electronic element package is an acceleration sensor comprising a plate-like sensor substrate 14, a plate-like first cover substrate 15 provided on a top surface of the sensor substrate 14, and a plate-like second cover substrate 16 provided on a bottom surface of the sensor substrate 14 with the plate-like sensor substrate 14 in the center; the three substrates are joined together.

Figure 2B:
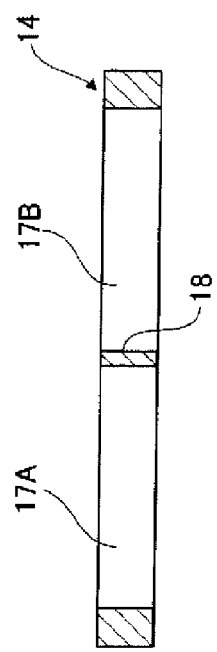
FIG. 2B is a sectional view of the sensor substrate according to Embodiment 1 taken along line B-BB in FIG. 2A.
Figure 2C:
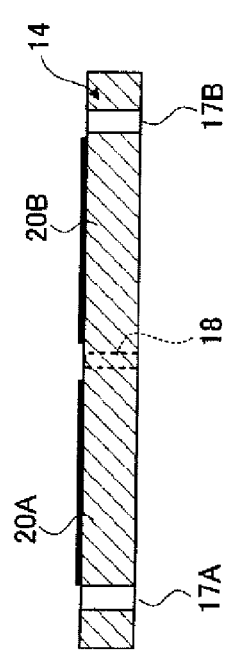
FIG. 2C is a sectional view of the sensor substrate according to Embodiment 1 taken along line C-CC in FIG. 2A.
Figure 2D:
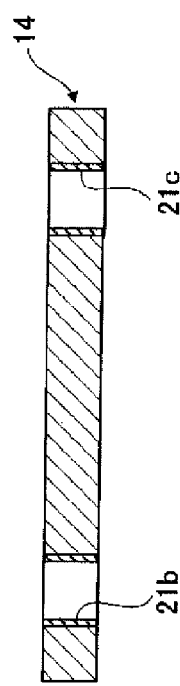
FIG. 2D is a sectional view of the sensor substrate according to Embodiment 1 taken along line D-DD in FIG. 2A.
Figure 2A:
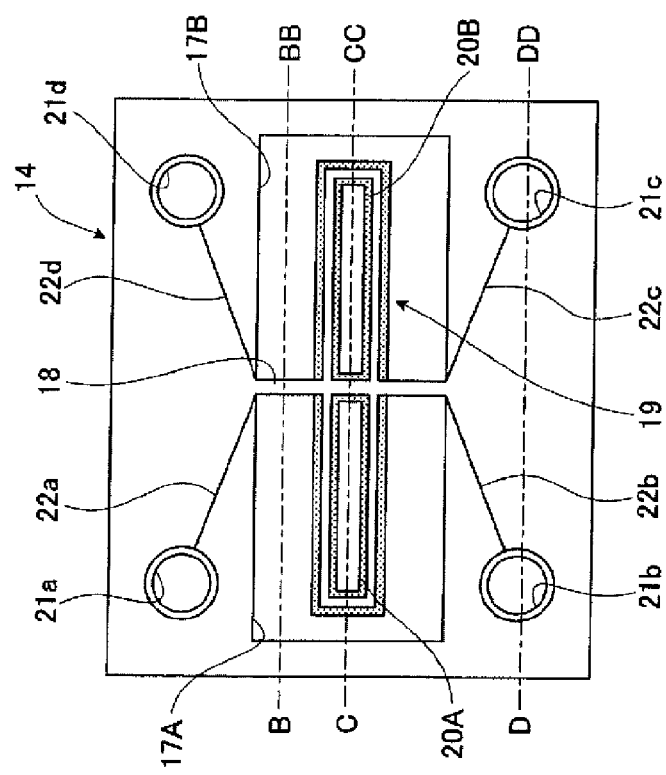
FIG. 2A is a plan view of a sensor substrate according to Embodiment 1.

The sensor substrate 14, made up of silicon or quartz, has holes 17A and 17B formed therein by dry etching or the like as shown in FIG. 2A and FIG. 2B showing a sectional view taken along line B-BB in FIG. 2A. The sensor substrate 14 also has a movable piece 19 formed therein and externally peripherally supported at the center thereof by a beam 18. A first detecting portion 20A is provided on a part of the movable piece 19 located on the right side of the beam 18. A second detecting portion 20B is provided on a part of the movable piece 19 located on the left side of the beam 18.

The first and second detecting portions 20A and 20B have a Pt film of thickness 0.3 μm formed on the movable piece 19, a PZT of thickness 2.75 μm formed on the Pt film, and an Au film of thickness 0.3 μm formed on the PZT as shown in FIG. 2C showing a sectional view taken along line C-CC in FIG. 2A.

Through-holes 21a, 21b, 21c, and 21d each having an electrode formed on an inner periphery thereof are each formed in the vicinity of a corresponding one of four corners of the sensor substrate 14 as shown in FIG. 2A and FIG. 2D showing a sectional view taken along line D-DD in FIG. 2A.

The through-holes 21a and 21b are connected to the Pt film and Au film in the first detecting portion 20A by wiring electrodes 22a and 22b, respectively, formed on the sensor substrate 14. The through-holes 21c and 21d are connected to the Pt film and Au film in the second detecting portion 20B by wiring electrodes 22c and 22d, respectively, formed on the sensor substrate 14.

The first cover substrate 15, made up of silicon or quartz, has a recessed portion 23 formed at a position corresponding to the first and second detecting portions 20A and 20B by dry etching or the like as shown in FIG. 3A and FIG. 3B showing a sectional view taken along line E-EE in FIG. 3A.

The second cover substrate 16, made up of silicon or quartz, has a recessed portion 24 formed at a position corresponding to the first and second detecting portions 20A and 20B by dry etching or the like as shown in FIG. 3C and FIG. 3D showing a sectional view taken along line F-FF in FIG. 3C. Through-holes 25a, 25b, 25c, and 25d each having an electrode formed on an inner periphery thereof are each formed in association with the through-holes 21a, 21b, 21c, and 21d in the sensor substrate 14 in the second cover substrate 16 as shown in FIG. 3C and FIG. 3D showing a sectional view taken along line F-FF in FIG. 3C.

The sensor substrate 14 is joined to the first cover substrate 15 and the second cover substrate 16 by a process described below.

Figure 4A:
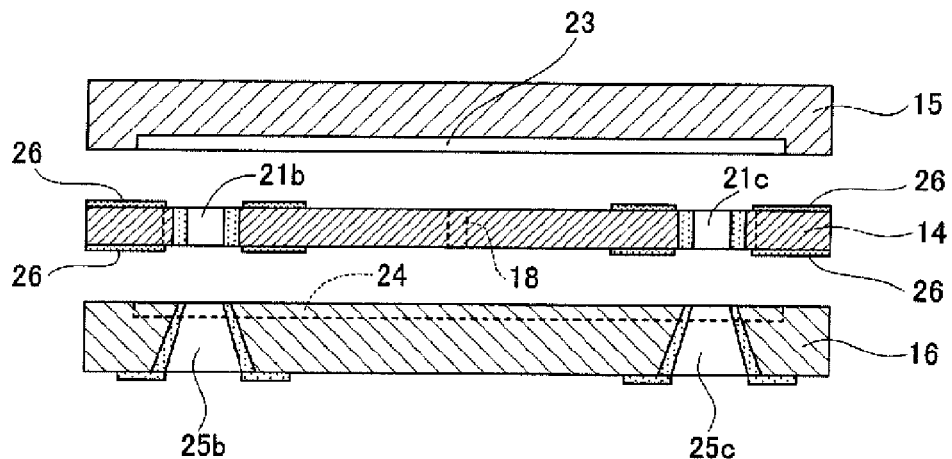
FIG. 4A is a sectional view of a joining process according to Embodiment 1.

In FIG. 4A, an adhesive 26 is applied to outer peripheries of the top and bottom surfaces of the sensor substrate 14, to peripheries of the through-holes 21a to 21d in the top surface of the sensor substrate 14, and to peripheries of the through-holes 21a to 21d in the bottom surface of the sensor substrate 14.

Figure 4B:
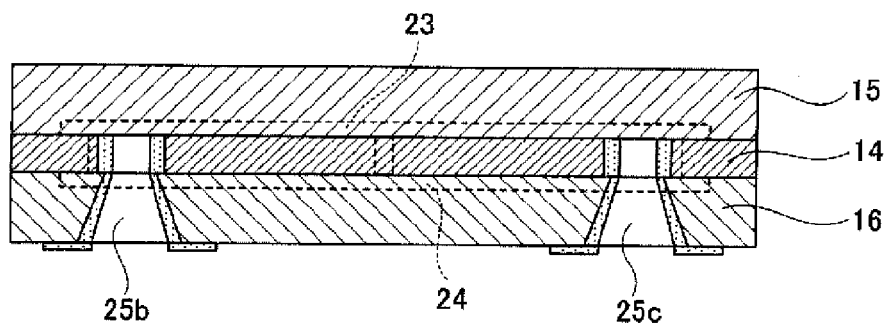
FIG. 4B is a sectional view of the joining process according to Embodiment 1.
Figure 4C:
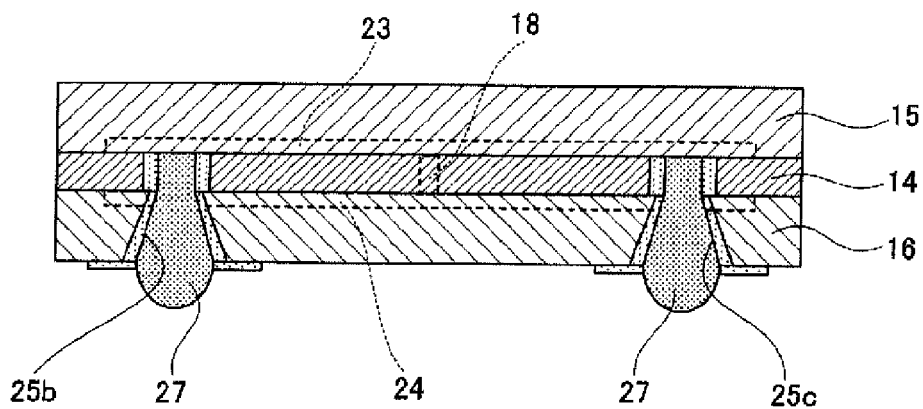
FIG. 4C is a sectional view of the joining process according to Embodiment 1.

In FIG. 4B, the sensor substrate 14 is laminated to the first cover substrate 15 and the second cover substrate 16. A solder 27 is subsequently fed through the through-holes 25a to 25d and reflowed to form external connection terminals, completing the assembly, as shown in FIG. 4C.

In the preceding description, the adhesive 26 is used by way of example. However, the junction can be achieved as follows. Specifically, in a vacuum chamber, a preprocess is executed by irradiating the top and bottom surfaces of the sensor substrate 14, a bottom surface of the first cover substrate 15, and a top surface of the second cover substrate 16 with energy, for example, plasma, atomic beams, or light energy for surface cleaning and activation. The sensor substrate 14 and the first cover substrate 15 are then joined together by a room-temperature joining process of, in the same vacuum chamber, abutting the top surface of the sensor substrate 14 against the bottom surface of the first cover substrate 15 and pressing the top surface of the sensor substrate 14 and the bottom surface of the first cover substrate 15 together. Further, abutting the bottom surface of the sensor substrate 14 against the top surface of the second cover substrate 16 and pressing the bottom surface of the sensor substrate 14 and the top surface of the first cover substrate 16 together. The solder 27 is subsequently fed through the through-holes 25a to 25d and reflowed to form external connection terminals, completing the assembly.

Now, a description will be given of the configuration of Embodiment 1 and the configuration shown in FIGS. 21 and 22 as a conventional example for the comparison of the configurations with each other.

Figure 21:
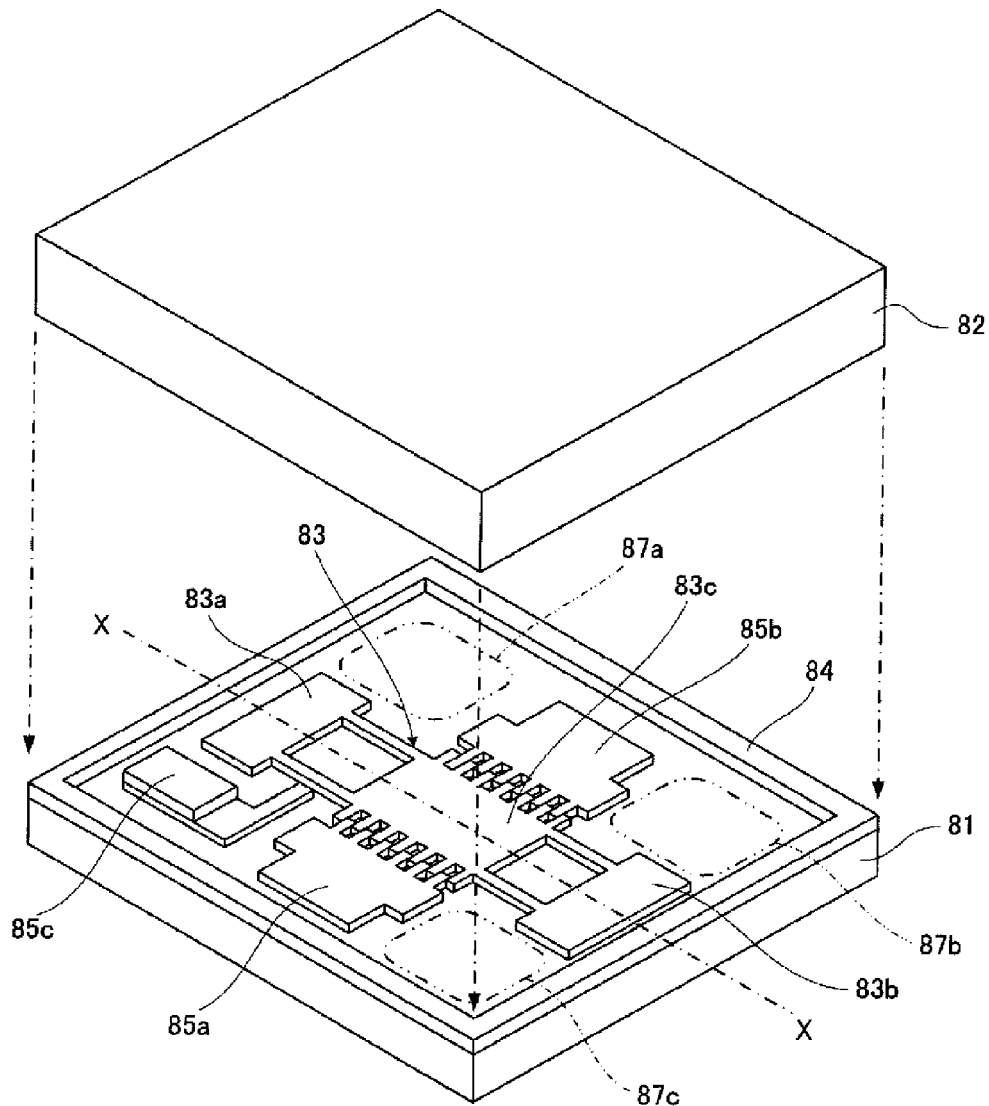
FIG. 21 is an exploded perspective view of an electronic element package according to Japanese Patent Laid-Open No. 2000-186931.
Figure 22:
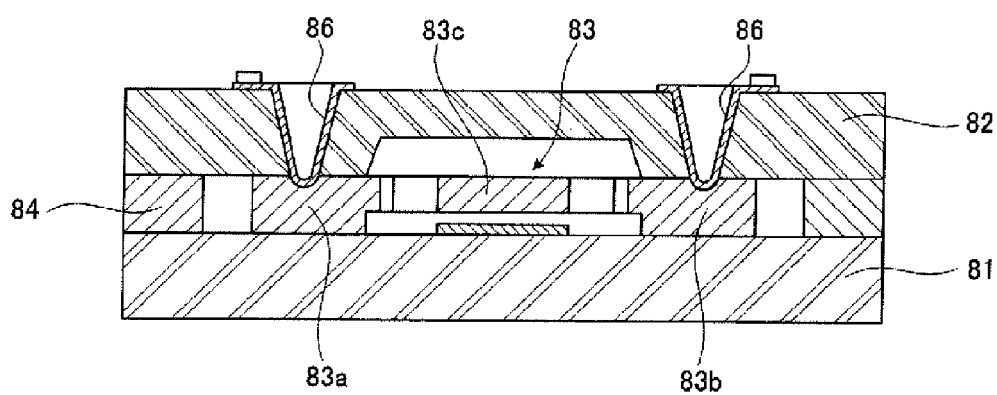
FIG. 22 is a sectional view of the electronic element package according to Japanese Patent Laid-Open No. 2000-186931.

The conventional example shown in FIGS. 21 and 22 is the seal structure in which the lower glass substrate 81 is laminated to the upper glass substrate 82. The lower glass substrate 81 is laminated to the upper glass substrate 82 only in small areas including the narrow frame portion 84 provided on the outer periphery of the lower glass substrate 81 and the signal output portions 85a, 85b, and 85c formed like islands independently of the frame portion 84 in part, to seal the interior of the electronic element package. The seal structure has gap areas 87a, 87b, and 87c located between the frame portion 84 and each of the signal output portions 85a, 85b, and 85c and which do not effectively contribute to hermetic sealing.

In contrast, the configuration of Embodiment 1 is the electronic element package in which the plate-like first and second cover substrates 15 and 16 are joined directly or indirectly to the top and bottom surfaces, respectively, of the sensor substrate 14 with the sensor substrate 14 in the center. In the electronic element package, the plate-like sensor substrate 14 with the movable piece 19 formed therein as a detector has the first and second detecting portions 20A and 20B, the outer periphery of the sensor substrate 14, which is the frame surrounding the first and second detecting portions 20A and 20B via the holes 17A and 17B as spaces, at least two beams 18a and 18b, connecting the movable pieces 19 to the outer periphery of the sensor substrate 14, and the through-holes 21a to 21d, disposed on the outer periphery of the sensor substrate 14 and electrically connected to the movable piece 19 to serve as electrodes. The through-holes 25a to 25d are formed in one of the first cover substrate 15 and the second cover substrate 16 and each have the inner walls of end surfaces which are in contact with at least a part of the corresponding one of the through-holes 21a to 21d. For the junction area in which the top surface of the sensor substrate 14 is joined to the bottom surface of the first cover substrate 15 and in which the bottom surface of the sensor substrate 14 is joined to the second cover substrate 16, the areas on the sensor substrate 14 in which the through-holes 21a to 21d are formed also constitute effective junction surfaces as seen in FIGS. 1B, 1C, and 2A. Furthermore, for the junction between the sensor substrate 14 and the second cover substrate 16, instead of only the narrow frame portion 84 contributing to the junction as shown in FIGS. 21 and 22, the areas on the sensor substrate 14 in which the through-holes 21a to 21d are formed also constitute effective junction surfaces contributing to the junction with the second cover substrate 16.

Therefore, in Embodiment 1, the junction area between the sensor substrate 14 and each of the first and second cover substrates 15 and 16 is larger than that in the conventional example, shown in FIGS. 21 and 22. This is effective for hermetic sealing, significantly improving reliability of the seal.

Embodiment 2

FIG. 5 shows Embodiment 2 of the present invention.

Figure 5A:
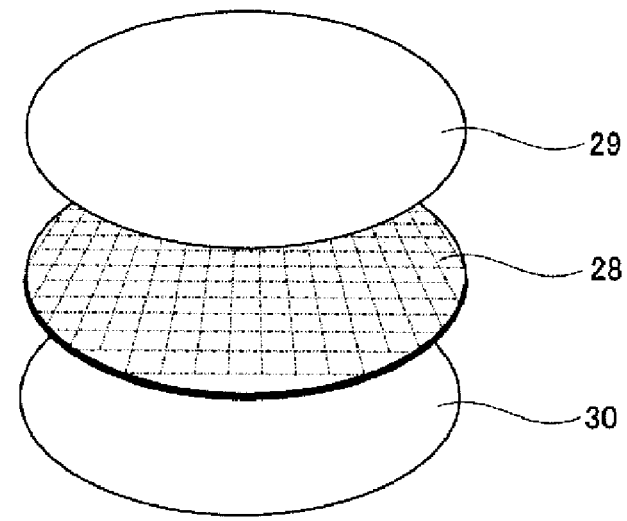
FIG. 5A is a diagram showing a manufacturing process according to Embodiment 2 of the present invention.
Figure 5B:
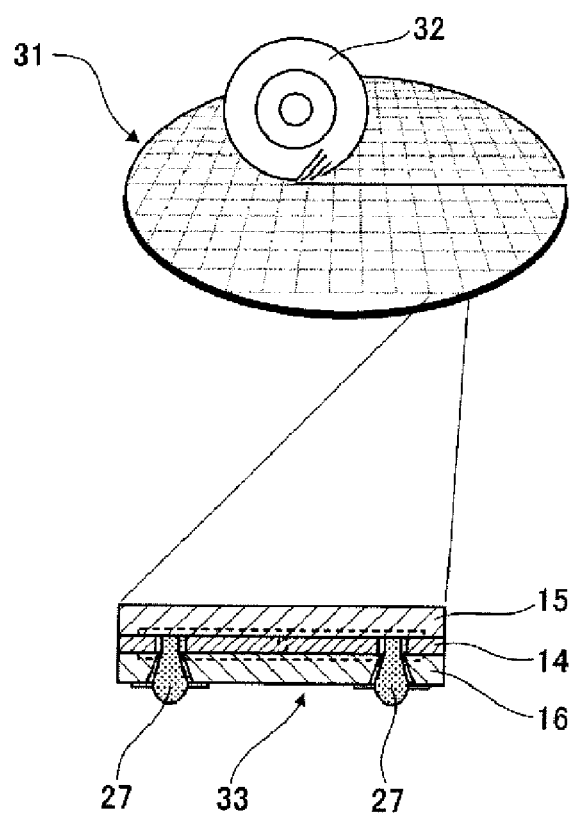
FIG. 5B is a diagram showing the manufacturing process according to Embodiment 2 of the present invention.

In Embodiment 1, the sensor substrate 14 is joined to each of the first and second cover substrates 15 and 16 for each electronic element package. However, in Embodiment 2, a junction wafer 31 is formed by joining a first wafer 28 on which a large number of the sensor substrates 14 are mounted, a second wafer 29 on which a large number of the first cover substrates 15 are mounted in association with the positions of the sensor substrates 14 on the first wafer 28, and a third wafer 30 on which a large number of the second cover substrates 16 are mounted in association with the positions of the sensor substrates 14 on the first wafer 28, as shown in FIG. 5A. In FIG. 5B, the junction wafer 31 is cut into electronic element packages 33 with a dicing saw 32.

Embodiment 3

In the above-described embodiments, the external connection terminals are each formed in the vicinity of the corresponding one of the four corners of the electronic element package. However, in Embodiment 3 shown in FIG. 6, external connection terminals are formed in the respective corners of an electronic element package.

Figure 6A:
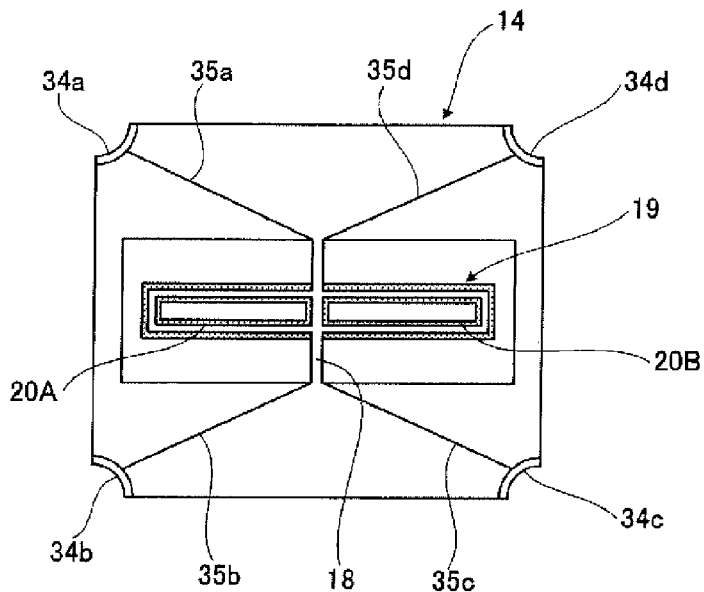
FIG. 6A is a plan view of a sensor substrate according to Embodiment 3 of the present invention.
Figure 6B:
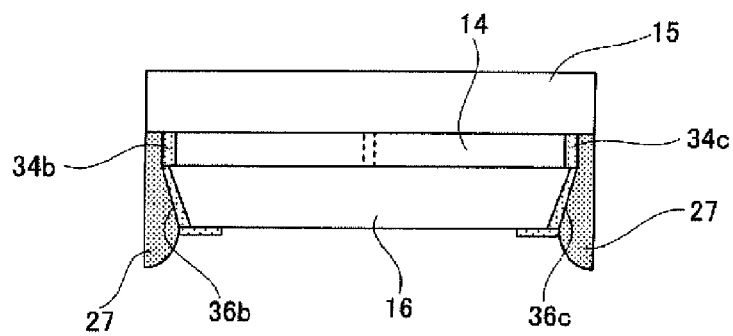
FIG. 6B is a sectional view of an electronic element package in which the sensor substrate has been completely assembled according to Embodiment 3.

FIG. 6A shows a sensor substrate 14 in this case. Circular electrodes 34a, 34b, 34c, and 34d are formed in the respective corners of the sensor substrate 14. The electrodes 34a and 34b are connected to a Pt film and Au film in a first detecting portion 20A by wiring electrodes 35a and 35b, respectively, formed on the sensor substrate 14. The electrodes 34c and 34d are connected to a Pt film and Au film in a second detecting portion 20B by wiring electrodes 35c and 35d, respectively, formed on the sensor substrate 14. Electrodes 36a, 36b, 36c, and 36d are similarly formed in the respective corners of a second cover substrate 16 in association with the electrodes 34a to 34d. As shown in FIG. 6B, the sensor substrate 14 is joined to each of the first and second cover substrates 15 and 16. A solder 27 is applied to all the electrodes so as to cover both the electrodes 34b and 36b, both the electrodes 34c and 36c, both the electrodes 34a and 36a, and both the electrodes 34d and 36d to form external connection electrodes.

Figure 6C:
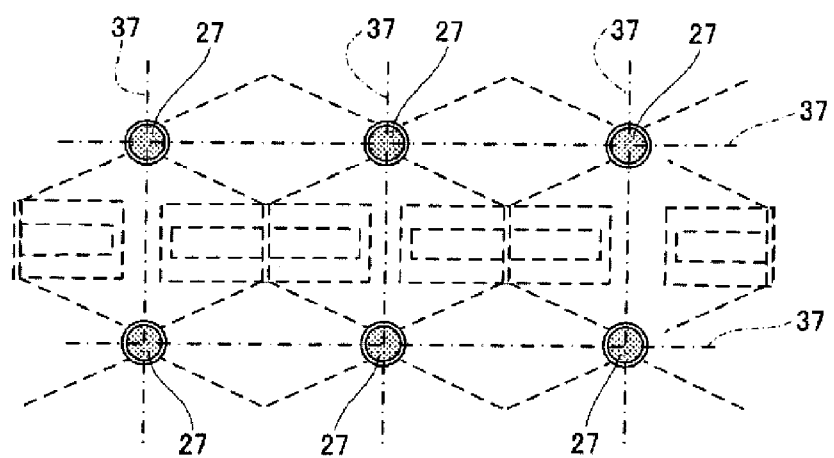
FIG. 6C is a bottom view of an assembly prior to cutting of the sensor substrate according to Embodiment 3.

A junction wafer 31 can be cut into electronic element packages as described above, with a dicing saw 32 as shown in FIG. 5. In this case, in the junction wafer 31 that has not been cut yet with the dicing saw 32, the solder is fed through through-holes in a third wafer 30 and reflowed. The portions of the wafer which form the external connection terminals as shown in FIG. 6C can be cut along cutting lines 37 with the dicing saw 32 to obtain the electronic element package 33 shown in FIG. 6B.

Embodiment 4

Figure 7A:
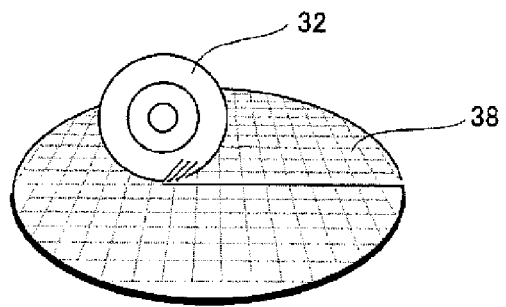
FIG. 7A is a diagram showing a manufacturing process according to Embodiment 4 of the present invention.
Figure 7B:
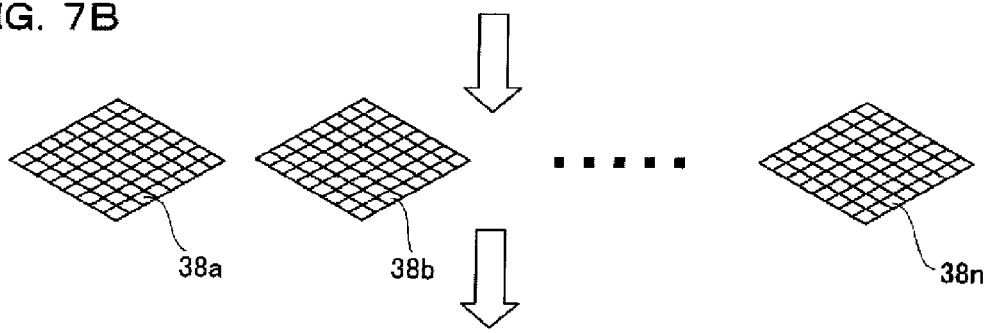
FIG. 7B is a diagram showing the manufacturing process according to Embodiment 4.
Figure 7C:
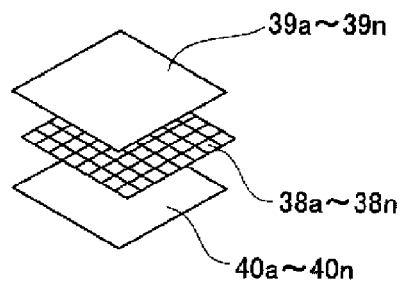
FIG. 7C is a diagram showing the manufacturing process according to Embodiment 4.
Figure 7D:
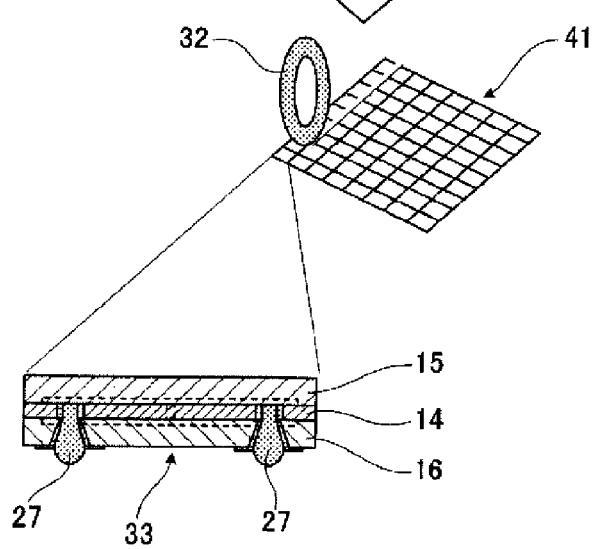
FIG. 7D is a diagram showing the manufacturing process according to Embodiment 4.

In Embodiment 2, the junction wafer 31 is cut into the electronic element packages 33 with the dicing saw 32. However, in Embodiment 4, as shown in FIGS. 7A and 7B, the first wafer 38 is cut into a plurality of assemblies 38a to 38n with the dicing saw 32. The second and third wafers 39 and 40 are also cut into a plurality of assemblies 39a to 39n and 40a to 40n having the same size as that of the assemblies 38a to 38n. In a step shown in FIG. 7C, the assemblies 38a to 38n, into which the first wafer 38 has been cut, are joined to the respective assemblies 39a to 39n, into which the second wafer 39 has been cut, and to the respective assemblies 40a to 40n, into which the third wafer 40 has been cut, to produce a junction assembly 41 with the respective assemblies 38a to 38n in the center. The junction assembly 41 is then cut into pieces with the dicing saw 32. Thus, even with a possible increase in the size of the original wafer, the junction process can be planned using the same apparatus.

Embodiment 5

Figure 9:
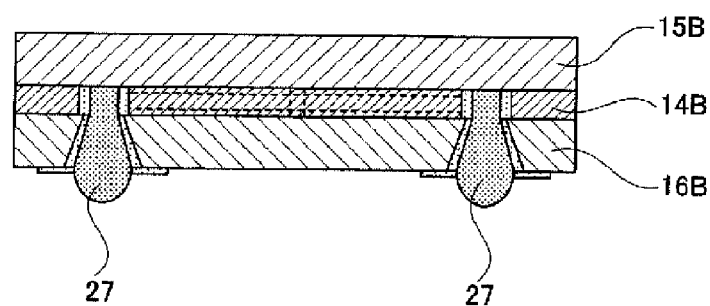
FIG. 9 is a sectional view of an electronic element package according to Embodiment 5.

FIGS. 8 and 9 show Embodiment 5 of the present invention.

In the above-described embodiments, the recessed portion 23 and 24, each corresponding to the first and second detecting portions 20A and 203 on the sensor substrate 14, are formed in the first cover substrate 15 and the second cover substrate 16, respectively. However, in a sensor substrate 14B in Embodiment 5, the recessed portions 23 and 24 are not formed in first and second cover substrates 15B and 16B as shown FIG. 9.

FIG. 8 shows the sensor substrate 14B in this case.

FIG. 8B is a sectional view of the sensor substrate 14B taken along line B-BB in FIG. 5A. FIG. 8C is a sectional view of the sensor substrate 14B taken along line C-CC in FIG. 8A.

FIG. 8D is a sectional view of the sensor substrate 14B taken along line D-DD in FIG. 8A. In the sensor substrate 14B, the first and second detecting portions 20A and 20B are formed to be thinner than an outer periphery 42 of the sensor substrate 14 as shown in FIG. 8C.

An electronic element package in Embodiment 5 is completely assembled by joining the first and second cover substrates 15B and 16B in which the recessed portions 23 and 24 have not been formed yet, to the top and bottom surfaces, respectively, of the sensor substrate 14B as shown in FIG. 9 and then feeding and reflowing a solder 27 to form external connection terminals.

Embodiment 6

Figure 10A:
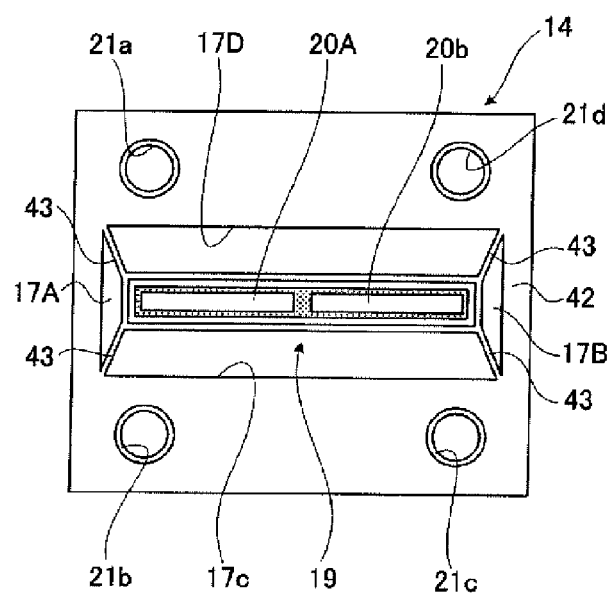
FIG. 10A is a plan view of a first sensor substrate according to Embodiment 6 of the present invention.
Figure 10B:
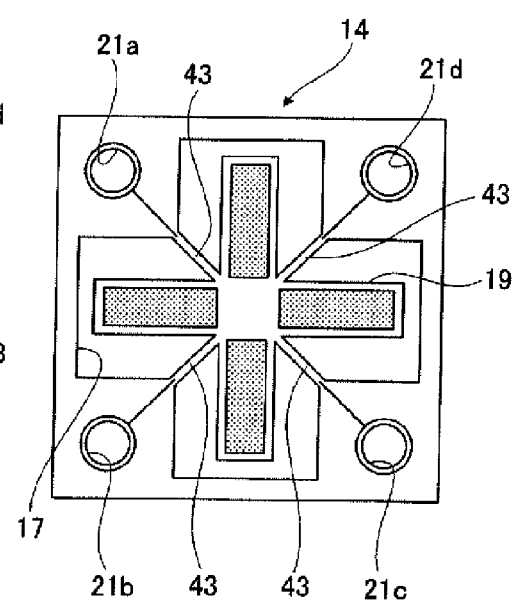
FIG. 10B is a plan view of a second sensor substrate according to Embodiment 6 of the present invention.

In the above-described embodiments, the sensor substrate in the electronic element package has the cantilever structure in which the central portion between the first and second detecting portions 20A and 20B is supported at one end thereof by the beam 18. However, a similar configuration can be obtained by forming holes 17A, 17D, 17C, and 17D such that a movable piece 19 is supported at the opposite ends thereof by beams 43 coupled to an outer periphery 42 of a sensor substrate 14 as shown in FIG. 10A. Alternatively, a similar configuration can be obtained by forming a hole 17 such that the movable piece 19 is supported by a plurality of the beams 43 coupled to the outer periphery 42 of the sensor substrate 14 as shown in FIG. 10B.

Embodiment 7

FIGS. 11 to 14 show Embodiment 7 of the present invention.

Figure 11A:
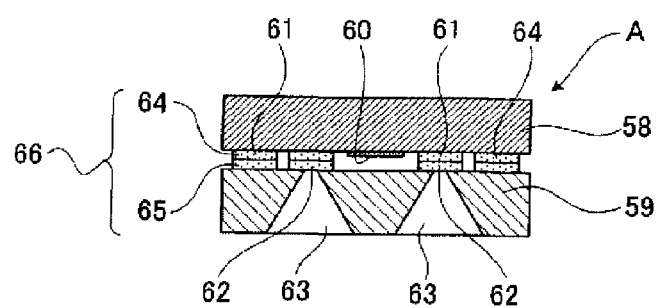
FIG. 11A is an enlarged sectional view of an electronic element package according to Embodiment 7 of the present invention.
Figure 11B:
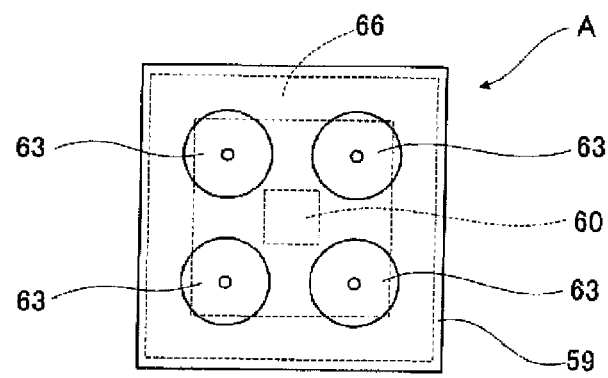
FIG. 11B is an enlarged bottom view of the electronic element package according to Embodiment 7.

FIG. 11A shows a sectional view of an electronic element package according to Embodiment 7 of the present invention. FIG. 11B shows a bottom view of the electronic element package.

An electronic element package A is constructed by laminating an element substrate 58 shown in FIG. 12 to a cover substrate 59 shown in FIG. 13.

Figure 12A:
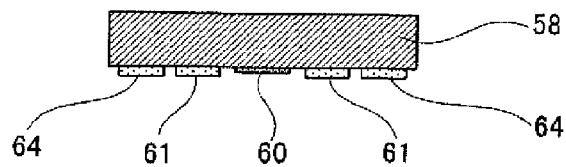
FIG. 12A is a sectional view of an element substrate 58 according to Embodiment 7.
Figure 12B:
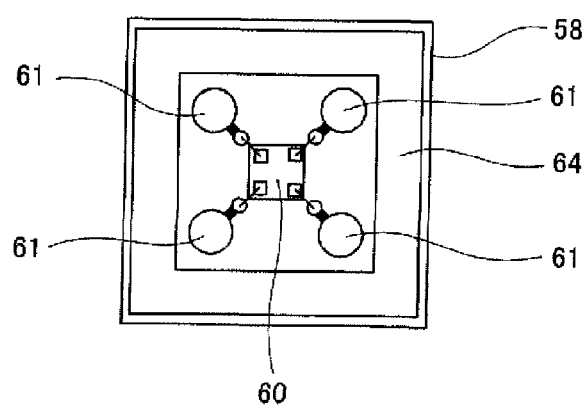
FIG. 12B is a plan view of the element substrate 58 according to Embodiment 7.

As shown in FIGS. 12A and 12B, an electronic element 60 and wiring electrodes 61 as first electrodes are formed on one surface of the element substrate 58. I/O lines from the electronic element 60 are electrically connected to the wiring electrodes 61.

Figure 13A:
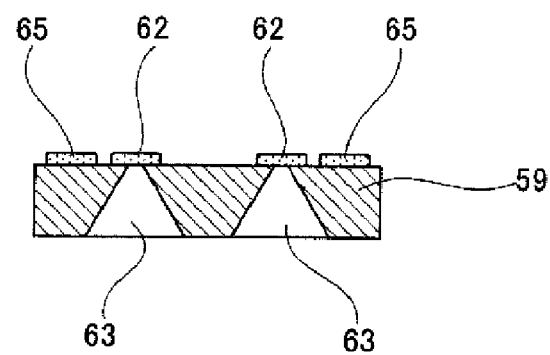
FIG. 13A is a sectional view of a cover substrate 59 according to Embodiment 7.
Figure 13B:
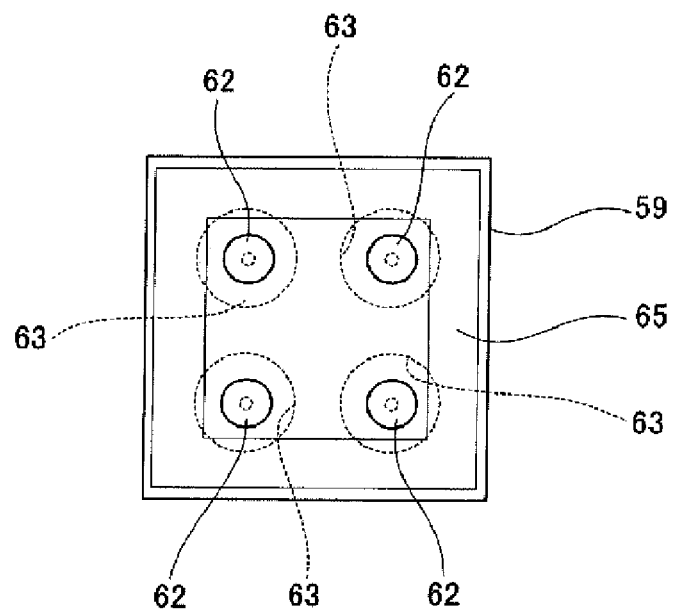
FIG. 13B is a plan view of the cover substrate 59 according to Embodiment 7.

As shown in FIGS. 13A and 13B, electrodes 62 as second electrodes and introduction holes 63 are formed on the cover substrate 59; the electrodes 62 are formed in association with the positions of the wiring electrodes 61 on the element substrate 58, and the introduction holes 63 are, for example, tapered and formed at positions corresponding to the first electrodes on the element substrate 58 and each have a diameter decreasing toward the element substrate 58. An element substrate 58-side end of each of the introduction holes 63 is closed by the corresponding one of the electrodes 62, formed on the cover substrate 59. The introduction holes 63 can be formed by laser, chemical etching, dry etching, blasting, or the like.

Moreover, an electrode 64 is annularly formed on the element substrate 58 so as to surround the electronic element 60. An electrode 65 is annularly formed on the cover substrate 59 in association with the electrode 64 on the element substrate 58. In the present embodiment, the wiring electrodes 61 and the electrodes 62 are formed of the same material, for example, gold. The electrodes 64 and 65 are formed of the same material, for example, gold.

The element substrate 58 and the cover substrate 59 are laminated together as follows. First, a preprocess is executed by irradiating the surfaces of the wiring electrodes 61 and the electrodes 64, 62, and 65 with, for example, plasma, atomic beams, or light energy in the vacuum chamber for surface cleaning and activation. The element substrate 58 and the cover substrate 59 are then joined together by the room-temperature joining process of, in the same vacuum chamber, abutting the surfaces of the wiring electrodes 61 on the element substrate 58 against the surfaces of the respective electrodes 62 on the cover substrate 59 and pressing the element substrate 58 and the cover substrate 59 together with the surfaces of the wiring electrodes 61 remaining in contact with the surfaces of the respective electrodes 62.

The joined annular electrodes 64 and 65 form a bulkhead portion 66 that surrounds and seals the electronic element 60.

Figure 14A:
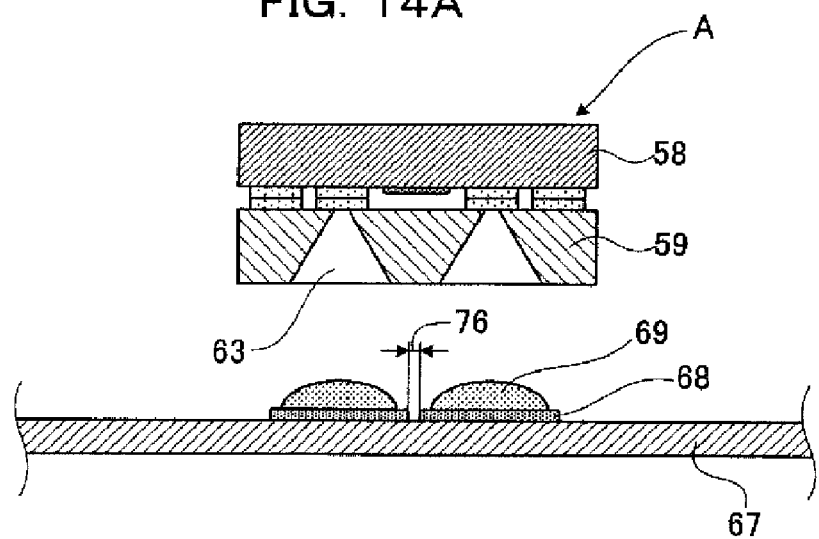
FIG. 14A is a sectional view of a mounting process according to Embodiment 7.
Figure 14B:
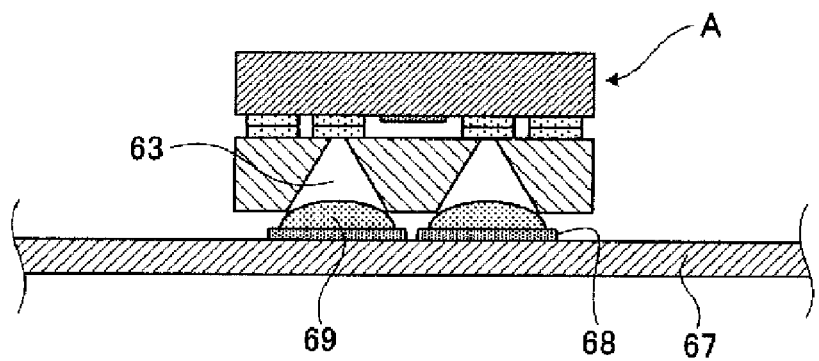
FIG. 14B is a sectional view of the mounting process according to Embodiment 7.
Figure 14C:
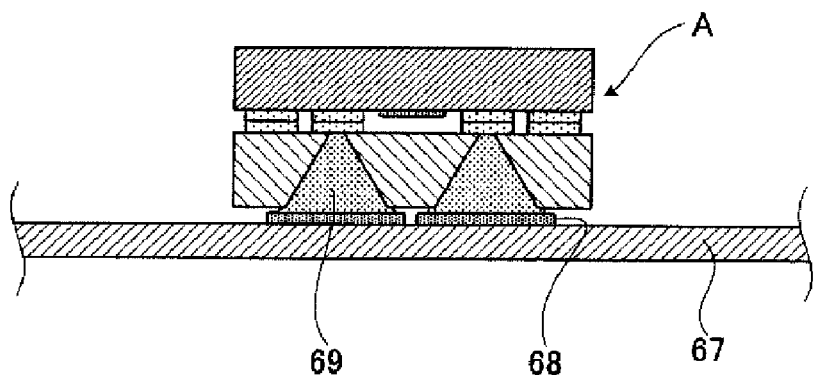
FIG. 14C is a sectional view of the mounting process according to Embodiment 7.

FIG. 14 shows a process of mounting the thus formed electronic element package A on lands 68 formed on a substrate 67.

First, as shown in FIG. 14A, solders 69 are placed as conductive materials on the respective lands 68 on the substrate 67. In FIG. 14B, the solders 69 are melted by reflowing, and the electronic element package A is pressed against the substrate 67 at a mounting position with the introduction holds 63 located opposite the substrate 67.

Thus, the melted solders 69 are guided toward the wiring electrodes 61 on the element substrate 58 through the introduction holes 63 and connected to the respective electrodes 62 on the cover substrate 59. In this state, the solders 69 are solidified to electrically connect the lands 68, formed on the substrate 67, to the electronic element 60 via the solders 69, the electrodes 62, and the wiring electrodes 61.

Bubbles may be present in the melted solders in the introduction holes during reflowing depending on a combination of the size of the introduction holes 63 or the wiring electrodes 61, the viscosity of the melted solders 69, and the like. The bubbles in the melted solders may make the electric connection between the electronic element 60 and the lands 68 on the substrate unstable. In this case, although not shown, a by-pass port through which the bubbles in the melted solders escape can be formed in a side surface of each of the introduction holes 63 to reduce the adverse effect of the bubbles in the melted solders on the electric connection.

Furthermore, this configuration enables mounting to be appropriately achieved without causing solder bridging even if a distance 76 between the lands is small compared to the size of the lands 68 on the substrate 67.

The present embodiment uses the solder 69 as a conductive material but may instead use a conductive resin. In this case, an uncured conductive resin provided on each of the lands 68 is pressed against the substrate 67 of the electronic element package A at the mounting position. The uncured conductive resin then flows through the introduction holes 63 to electrically connect the lands 68, formed on the substrate 67, to the electronic element 60 via the conductive resin, the electrodes 62, and the wiring electrodes 61. Subsequently, the substrate can be effectively heated to cure the conductive resin.

Embodiment 8

Figure 15:
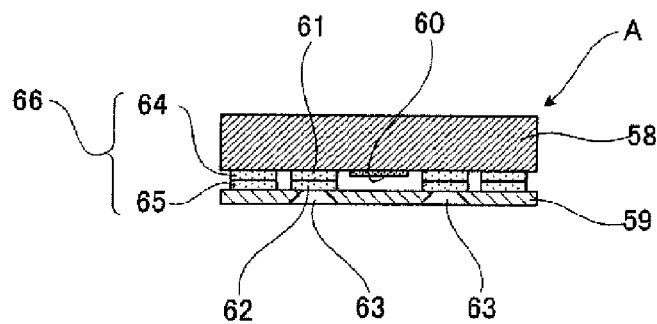
FIG. 15 is an enlarged sectional view of an electronic element package according to Embodiment 8 of the present invention.

FIG. 15 shows Embodiment 8 of the present invention.

In Embodiment 7, the electronic element package A is relatively thick; the element substrate 58 has a thickness of about 0.2 to 0.3 mm, and the cover substrate 59 has a thickness of at least 0.3 mm. However, the present invention may be similarly implemented with a relatively thick electronic element package in which a cover substrate 59 has a thickness of at most 0.2 mm as shown in FIG. 15.

Embodiment 9

Figure 16A:
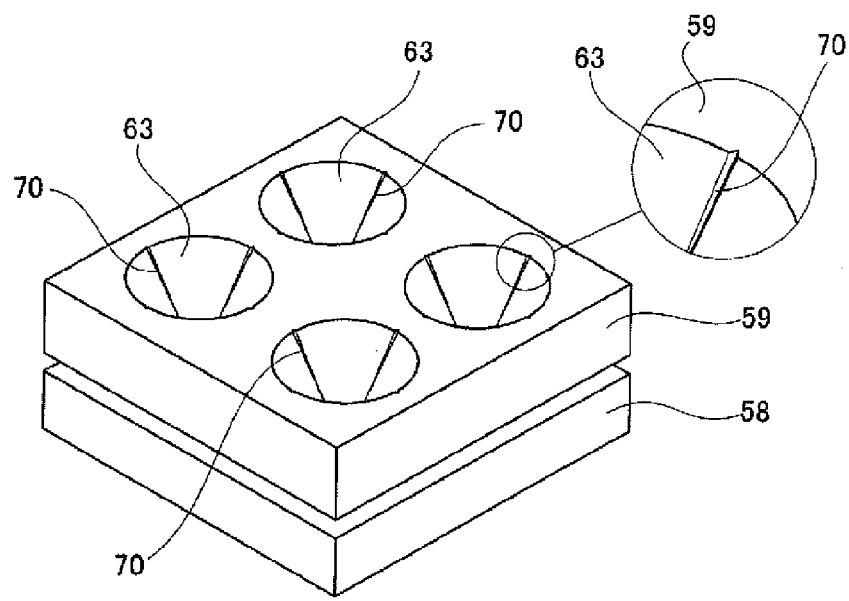
FIG. 16A is an enlarged bottom view of an electronic element package according to Embodiment 9 of the present invention.
Figure 16B:
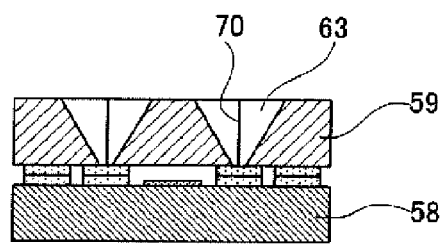
FIG. 16B is an enlarged sectional view of the electronic element package according to Embodiment 9 of the present invention.

FIG. 16 shows Embodiment 9 of the present invention.

In Embodiment 7, the introduction hole 63 has a smooth inner peripheral surface. However, in Embodiment 9 shown in FIG. 16, a groove 70 extending toward an element substrate 58 is formed in an inner peripheral surface of an introduction hole 63. The groove 70 thus formed improves the wettability of a solder as a result of a capillary phenomenon. This provides an electronic element package with a more stable junction quality.

Embodiment 10

FIG. 17 shows Embodiment 10 of the present invention.

FIG. 17 shows a process of manufacturing an electronic element package.

Figure 17A:
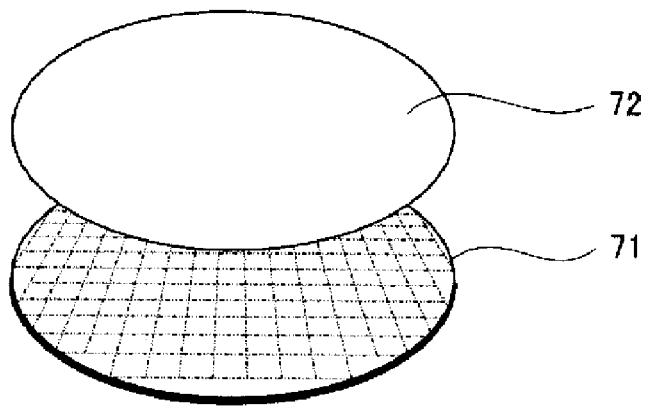
FIG. 17A is a diagram of a process of manufacturing an electronic element package according to Embodiment 10 of the present invention.

As shown in FIG. 17A, a plurality of element substrates 58 are mounted on a semiconductor wafer 71. A plurality of the cover substrates 59 are similarly mounted on a cover wafer 72.

Electrodes 64 and 65 of a bulkhead portion 66 are formed of metallic materials on the semiconductor wafer 71 and the cover wafer 72 by sputtering and a plating process as a grid-like pattern.

Figure 17B:
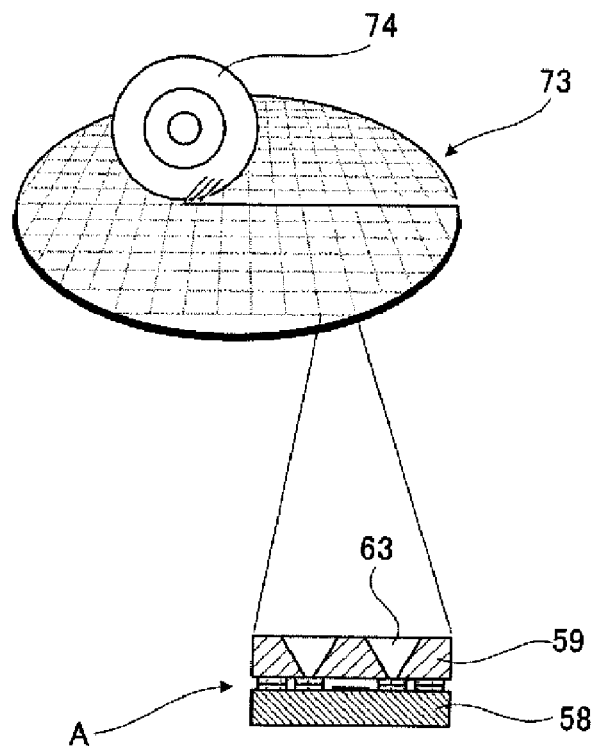
FIG. 17B is a diagram of the process of manufacturing the electronic element package according to Embodiment 10.

The room-temperature joining process of performing, in the vacuum chamber, cleaning and activation based on the application of a load is executed to join and integrate the semiconductor wafer 71 and the cover wafer 72 together to obtain a junction semiconductor wafer 73. The junction semiconductor wafer 73 is then cut into the electronic element packages A with a dicing saw 74 as shown in FIG. 17B.

Embodiment 11

Figure 18:
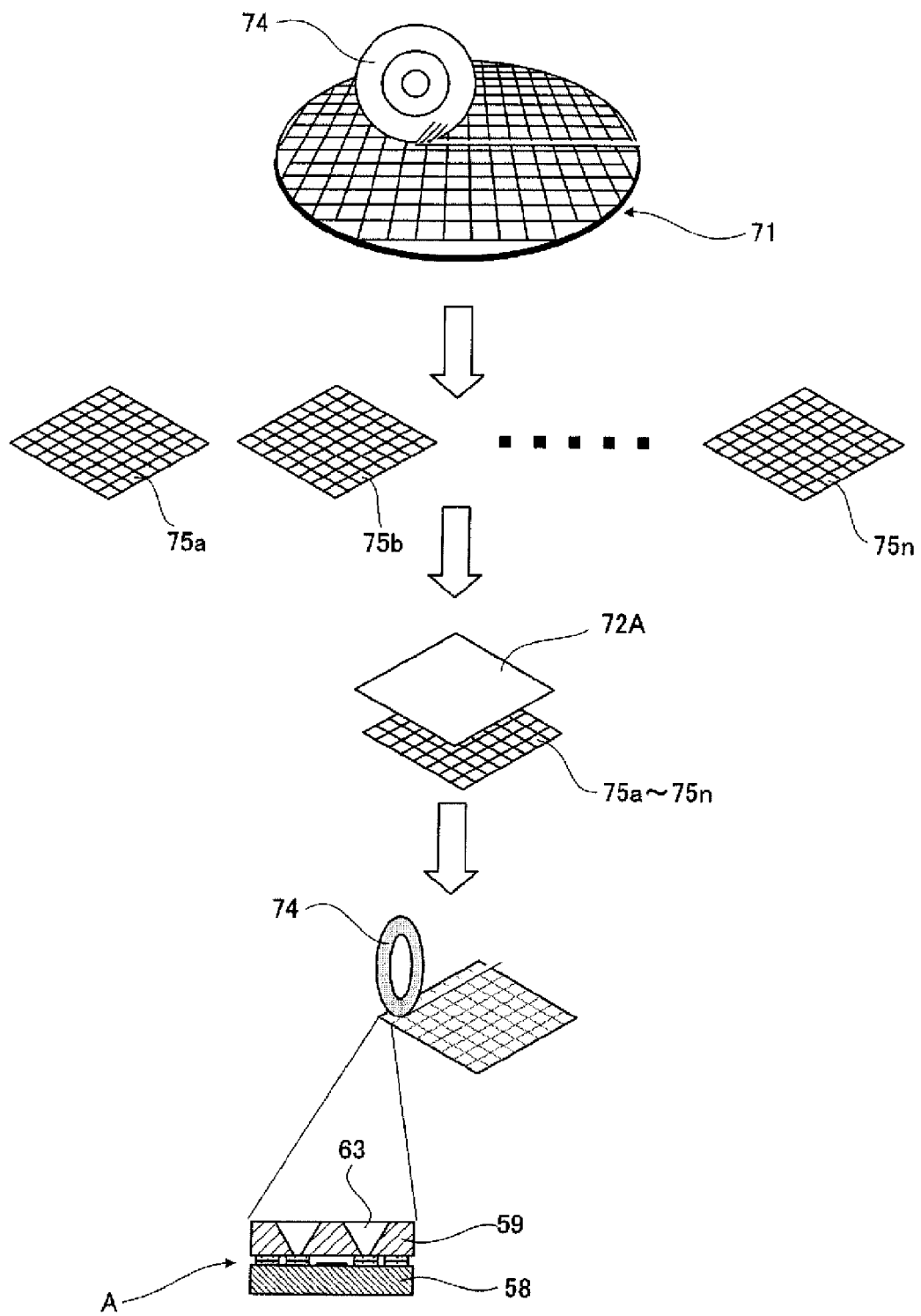
FIG. 18 is a diagram of a process of manufacturing an electronic element package according to Embodiment 11 of the present invention.
Figure 19:
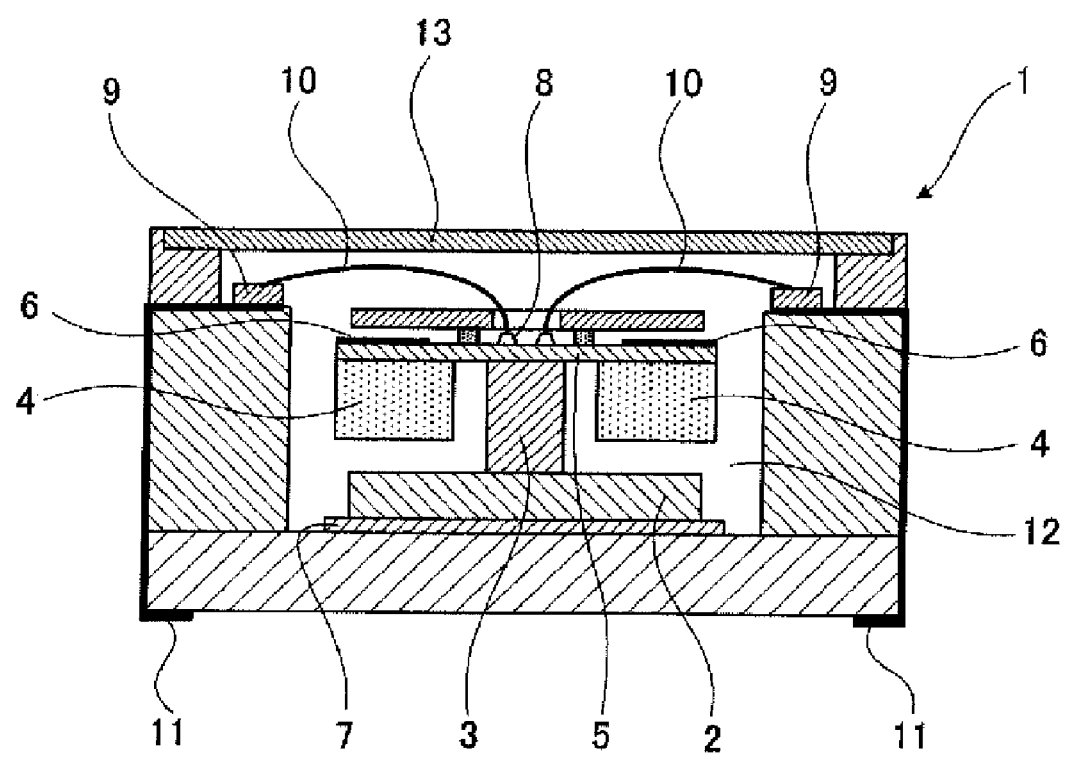
FIG. 19 is an enlarged sectional view of an electronic element package according to Japanese Patent Laid-Open No. 2006-170856.
Figure 20:
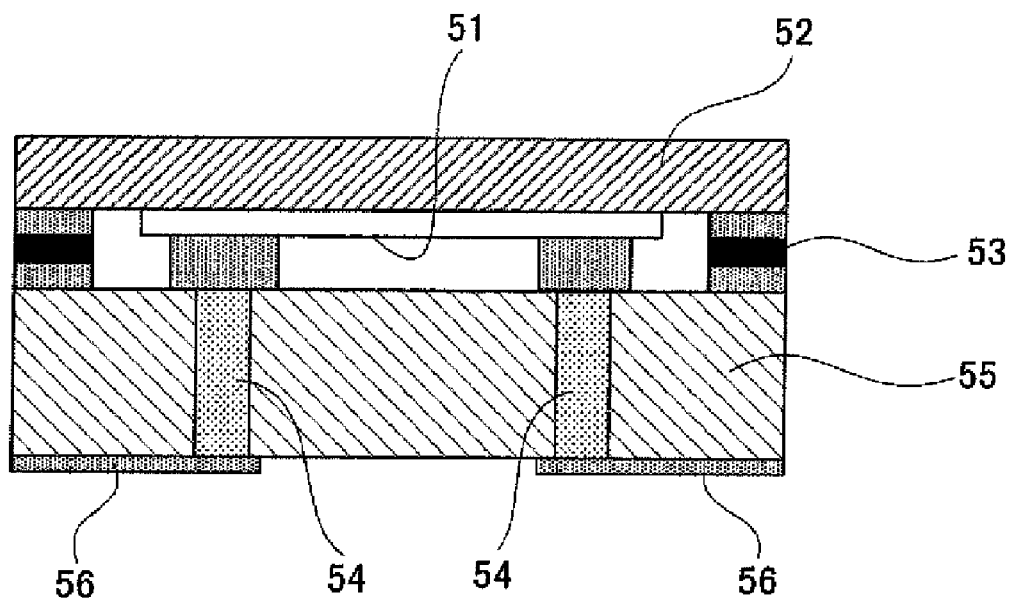
FIG. 20 is an enlarged sectional view of an electronic element package according to Japanese Patent Laid-Open No. 6-318625.

In Embodiment 10, the single junction semiconductor wafer 73 is cut into the electronic element package A with the dicing saw 74. However, as shown in FIG. 18, a single semiconductor wafer 71 is cut into a plurality of assemblies 75*a* to 75*n*. A cover wafer 72A having the same size as that of the entirety of the assemblies 75*a* to 75*n* is then joined to the assemblies 75*a* to 75*n*. The junction is then cut into pieces with a dicing saw 74. Thus, even with a possible increase in the size of the original wafer, the junction process can be planned using the same apparatus.

In Embodiment 9, the grooves 70 are formed in order to improve the wettability of the inner peripheral surface of the introduction holes 63. However, an inner peripheral surface of an introduction hole 63 may be composed of a matte surface to improve the wettability for a conductive material or a film improving the wettability for the conductive material may be formed on the inner peripheral surface.

Embodiment 12

In the embodiments shown in FIGS. 1 to 10, the through-holes 21*a* to 21*d* are disposed on the outer periphery of the sensor substrate 14 and electrically connected to the movable piece 19 to serve as electrodes. The through-holes 25*a* to 25*d* are formed in the first cover substrate 15 or the second cover substrate 16 and each have the inner wall as an end surface which contacts the corresponding one of the through-holes 21*a* to 21*d*. However, instead of the through-holes 25*a* to 25*d* each having the conductive film formed inside, only through-holes each having a diameter decreasing toward a substrate 14 may be formed like the tapered introduction holes 63 in the embodiments shown in FIGS. 11 to 18. Then, as shown in FIG. 14, an electronic element package may be pressed against the substrate 14 at the mounting position to guide a conductive material placed on lands located at the mounting position, to electrodes on the sensor substrate 14 through the introduction holes in the electronic element package for electric connection.

Embodiment 13

In the embodiments shown in FIGS. 1 to 10 and Embodiment 12, the through-holes each having the inner wall as the end surface contacting the corresponding one of the through-holes 21*a* to 21*d* are formed in only one of the first cover substrate 15 and the second cover substrate 16, sandwiching the sensor substrate 14 therebetween, that is, the second cover substrate 16. However, through-holes each having an inner wall as an end surface contacting the corresponding one of through-holes 21*a* to 21*d* may be formed in both a first cover substrate 15 and a second cover substrate 16.

The present invention can contribute to providing an electronic element package which enables a reduction in thickness and which offers improved reliability.

What is claimed is:

1. An electronic element package comprising
a plate-like sensor substrate having a detector formed thereon, and a plate-like first cover substrate and a plate-like second cover substrate joined directly or indirectly to a top surface and a bottom surface, respectively, of the sensor substrate so that the sensor substrate is located between the first and second cover substrates,
the sensor substrate comprising:
at least a first detecting portion and a second detecting portion as the detector; a frame surrounding but spaced from the detector; at least two beams joining the detector to the frame; and an electrode on the frame and electrically connected to the detector,
one of the first cover substrate and the second cover substrate including a through-hole having an inner wall whose end surface contacts at least a part of the electrode,
wherein the first detecting portion and the second detecting portion are coplanar; and
wherein portions of a surface of the cover substrates located opposite the sensor substrate are recessed, and positioned in association with the detecting portions.

2. The electronic element package according to claim 1, wherein the electrode is in an area surrounded by a partial side of the frame which is located opposite the detector via the space and an outer periphery of the frame.

3. The electronic element package according to claim 1, wherein the sensor substrate is formed thinner in a portion thereof occupied by the detector than in a periphery thereof.

\* \* \* \* \*